(12) United States Patent
Li et al.

(10) Patent No.: US 9,761,632 B2
(45) Date of Patent: Sep. 12, 2017

(54) DISPLAY SUBSTRATE AND METHOD OF MANUFACTURING THE SAME, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Bin Li, Beijing (CN); Xiangwan Lu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/547,073

(22) Filed: Nov. 18, 2014

(65) Prior Publication Data

US 2016/0005790 A1    Jan. 7, 2016

(30) Foreign Application Priority Data

Jul. 4, 2014  (CN) .......................... 2014 1 0318552

(51) Int. Cl.
*H01L 27/15*     (2006.01)
*H01L 33/58*     (2010.01)
(Continued)

(52) U.S. Cl.
CPC ........ *H01L 27/156* (2013.01); *G02F 1/13394* (2013.01); *G02F 1/133514* (2013.01);
(Continued)

(58) Field of Classification Search
CPC ..... H01L 27/156; H01L 33/58; H01L 33/502; H01L 2933/0058; H01L 2933/0041;
(Continued)

(56) References Cited

U.S. PATENT DOCUMENTS

2005/0206812 A1    9/2005  Tsubata
2007/0002263 A1*   1/2007  Kim .................... G02F 1/13394
                                                             349/156

(Continued)

FOREIGN PATENT DOCUMENTS

CN         1892346 A      1/2007
CN       101055382 A     10/2007
(Continued)

OTHER PUBLICATIONS

First Chinese Office Action (including English translation) dated May 12, 2016, for corresponding Chinese Application No. 201410318552.7.

(Continued)

*Primary Examiner* — Moazzam Hossain
*Assistant Examiner* — Farun Lu
(74) *Attorney, Agent, or Firm* — Kinney & Lange, P.A.

(57) ABSTRACT

Embodiments of the present invention disclose a display substrate and a method of manufacturing the same, and a display device comprising the display substrate. The display substrate comprises: a substrate; a black matrix layer and a color filter layer located on the substrate; and at least one main spacer and at least one secondary spacer located on the black matrix layer or the color filter layer and both having direct projections on the substrate within a region where the black matrix layer is located. A sum of thicknesses of portions of the black matrix layer and the color filter layer corresponding to each secondary spacer is smaller than that of portions of the black matrix layer and the color filter layer (Continued)

corresponding to each main spacer, so that a distance from a top end of the secondary spacer to the substrate is smaller than a distance from a top end of the main spacer to the substrate. As a result, a difference between the distance from the top end of the main spacer to the substrate and the distance from the top end of the secondary spacer to the substrate can be varied by adjusting a difference between the sum of thicknesses of the black matrix layer and the color filter layer directly below each main spacer and the sum of thicknesses of the black matrix layer and the color filter layer directly below each secondary spacer, thereby enabling the main spacer and the secondary spacer to provide a good effect of buffering an external force.

15 Claims, 5 Drawing Sheets

(51) Int. Cl.
- *H01L 33/50* (2010.01)
- *H01L 51/52* (2006.01)
- *H01L 27/32* (2006.01)
- *G02F 1/1335* (2006.01)
- *G02F 1/1339* (2006.01)

(52) U.S. Cl.
CPC .......... *H01L 27/322* (2013.01); *H01L 33/502* (2013.01); *H01L 33/58* (2013.01); *H01L 51/525* (2013.01); *H01L 51/5284* (2013.01); *G02F 2001/13396* (2013.01); *H01L 2933/0041* (2013.01); *H01L 2933/0058* (2013.01)

(58) Field of Classification Search
CPC . H01L 27/322; H01L 51/525; H01L 51/5284; H01L 27/14621; G02F 1/133514; G02F 1/13394; G02F 2001/13396; G02F 1/133
See application file for complete search history.

(56) References Cited

U.S. PATENT DOCUMENTS

| | | | | |
|---|---|---|---|---|
| 2009/0244427 A1* | 10/2009 | Chang | ................. | G02F 1/13458 349/54 |
| 2010/0007843 A1* | 1/2010 | Shen | ................... | G02F 1/13394 349/155 |
| 2012/0081641 A1* | 4/2012 | Noh | .................... | G02F 1/13394 349/106 |
| 2013/0050619 A1* | 2/2013 | Kim | .................... | G02F 1/13394 349/106 |
| 2015/0029428 A1* | 1/2015 | Wang | ..................... | G02B 5/201 349/42 |

FOREIGN PATENT DOCUMENTS

| | | |
|---|---|---|
| CN | 101334561 A | 12/2008 |
| CN | 102955296 A | 3/2013 |
| CN | 103257482 A | 8/2013 |

OTHER PUBLICATIONS

Second Chinese Office Action (including English translation) dated Nov. 3, 2016, for corresponding Chinese Application No. 201410318552.7.

Chinese Rejection Decision, for Chinese Patent Application No. 201410318552.7, dated Apr. 7, 2017, 21 pages.

\* cited by examiner

DISPLAY SUBSTRATE AND METHOD OF MANUFACTURING THE SAME, AND DISPLAY DEVICE

CROSS-REFERENCE TO RELATED APPLICATION

This application claims the benefit of the Chinese Patent Application No. 201410318552.7 filed on Jul. 4, 2014 in the State Intellectual Property Office of China, the whole disclosure of which is incorporated herein by reference.

BACKGROUND OF THE INVENTION

Field of the Invention

Embodiments of the present invention generally relate to display technique field, and in particular, to a display substrate and a method of manufacturing the same, and a display device comprising the display substrate.

Description of the Related Art

With a booming development of the display technology, flat panel displays, such as Light Emitting Diode (LED) display, Organic Light Emitting Diode (OLED) display, Plasma Display Panel (PDP) and Liquid Crystal Display (LCD), etc., have been developed rapidly.

Figure 1A:
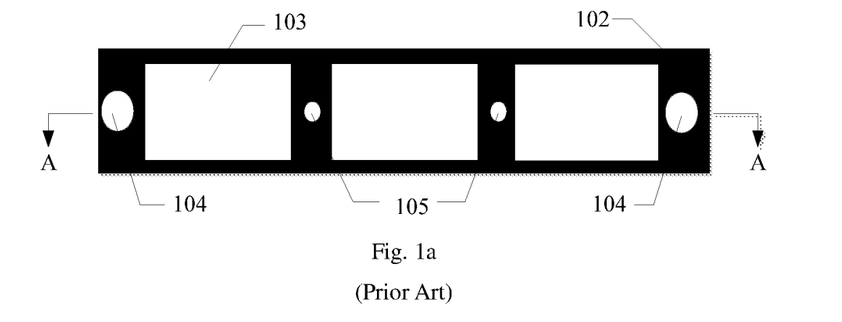
FIG. 1A is a top view of a color filter substrate in a prior art liquid crystal display.
Figure 1B:
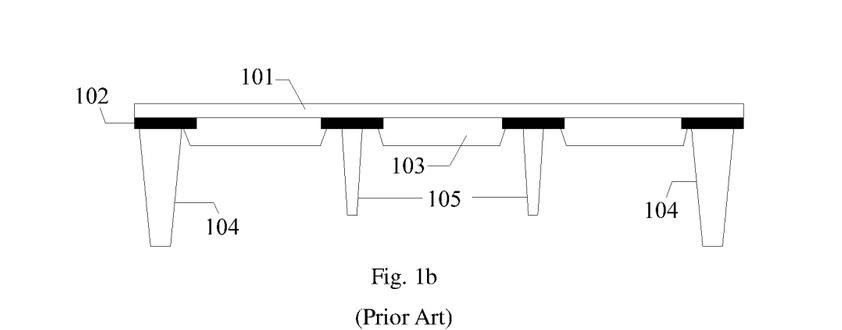
FIG. 1B is a sectional view taken along an A-A direction shown in FIG. 1A, showing one configuration of the color filter substrate in the prior art liquid crystal display.
Figure 1C:
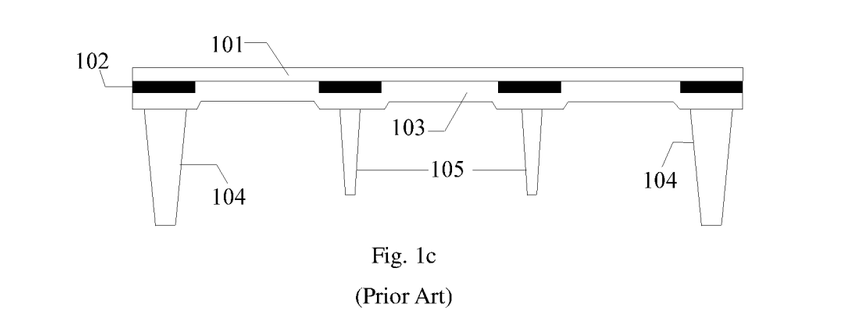
FIG. 1C is another schematic structural view of a color filter substrate in a prior art liquid crystal display.

For example, a liquid crystal display generally comprises a color filter substrate and an array substrate arranged to be opposed to each other, and a liquid crystal layer located between the two substrates. As shown in the FIGS. 1A and 1B (in which FIG. 1B is a sectional view taken along an A-A direction shown in FIG. 1A), the color filter substrate of the liquid crystal display comprises: a substrate 101, and a black matrix layer 102, a color filter layer 103, main spacer s 104 and secondary spacers 105 on the substrate 101; wherein the color filter layer 103 is located within gaps of the black matrix layer 102, both the main spacers 104 and the secondary spacers 105 are located on the black matrix layer 102, and bottoms of the main spacers 104 and the secondary spacers 105 are spaced from the substrate 101 by the same distance which is a thickness of the black matrix layer 102; or, the color filter substrate may have a configuration as shown in FIG. 1C, in which the color filter layer 103 is wholly arranged on the substrate 101 and covers over the black matrix layer 102, both the main spacers 104 and the secondary spacers 105 are located on the color filter layer 103, and bottoms of the main spacer 104 and the secondary spacer 105 are spaced from the substrate 101 by the same distance which is a sum of thicknesses of the color filter layer 103 and the black matrix layer 102.

In the above arrangements of the color filter substrate, the main spacers and the secondary spacers are located on the same horizontal plane, that is, a distance from the bottoms of the main spacers to the substrate is equal to a distance from the bottoms of the secondary spacers to the substrate. When the liquid crystal display is pressed by an external force, in order to provide an effect of buffering the external force by the main spacers and the secondary spacers, it is required to provide height difference between the main spacers and the secondary spacers, that is, height of the main spacers is larger than that of the secondary spacers, so that the height difference between the main spacers and the secondary spacers can provide some deformation amount of the liquid crystal display, thereby achieving a purpose of buffering the external force.

In prior arts, the main spacers and the secondary spacers are formed through a single one patterning process by using the same mask plate. In order to provide height difference between the main spacers and the secondary spacers, an area of a region of the mask plate for forming the secondary spacer is often designed to be smaller than that of a region of the mask plate for forming the main spacer. In other words, a projection area of the formed secondary spacer on the substrate is smaller than that of the main spacer on substrate (as shown in the FIG. 1A), so that the height of the secondary spacer is smaller than that of the main spacer. However, since the area of the region of the mask plate for forming the secondary spacer is smaller, height uniformity of the formed secondary spacers is poorer, thereby adversely affecting the effect of buffering the external force provided by the main spacers and the secondary spacers.

SUMMARY OF THE INVENTION

The present invention is made to overcome or eliminate at least one of the above and other problems and defects.

In one aspect of the present invention, there is provided a display substrate, comprising: a substrate; a black matrix layer and a color filter layer located on the substrate; and at least one main spacer and at least one secondary spacer located on the black matrix layer or the color filter layer and both having direct projections on the substrate within a region where the black matrix layer is located. A sum of thicknesses of portions of the black matrix layer and the color filter layer corresponding to each secondary spacer is smaller than that of portions of the black matrix layer and the color filter layer corresponding to each main spacer, so that a distance from a top end of the secondary spacer to the substrate is smaller than a distance from a top end of the main spacer to the substrate.

In another aspect of the present invention, there is provided a method of manufacturing a display substrate, comprising: forming a black matrix layer and a color filter layer on a substrate; and forming, over the substrate on which the black matrix layer and the color filter layer have been formed, at least one main spacer and at least one secondary spacer on the black matrix layer or the color filter layer; wherein, direct projections of the main spacer and the secondary spacer on the substrate are within a region where the black matrix layer is located, and a sum of thicknesses of portions of the black matrix layer and the color filter layer corresponding to each secondary spacer is smaller than that of portions of the black matrix layer and the color filter layer corresponding to each main spacer, so that a distance from a top end of the secondary spacer to the substrate is smaller than a distance from a top end of the main spacer to the substrate.

In a further aspect of the present invention, there is provided a display device comprising the display substrate as described above.

DETAILED DESCRIPTION OF PREFERRED EMBODIMENTS OF THE INVENTION

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

Shapes, thicknesses and the like of various layers, films and structures shown in the drawings are not scaled by real proportions, but are intended to exemplarily illustrate the present disclosure.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of embodiments of the present invention, there is provided a display substrate, comprising: a substrate; a black matrix layer and a color filter layer located on the substrate; and at least one main spacer and at least one secondary spacer located on the black matrix layer or the color filter layer and both having direct projections on the substrate within a region where the black matrix layer is located. A sum of thicknesses of portions of the black matrix layer and the color filter layer corresponding to each secondary spacer is smaller than that of portions of the black matrix layer and the color filter layer corresponding to each main spacer, so that a distance from a top end of the secondary spacer to the substrate is smaller than a distance from a top end of the main spacer to the substrate.

In the display substrate according to embodiments of the present invention, the sum of thicknesses of portions of the black matrix layer and the color filter layer corresponding to each secondary spacer is smaller than that of portions of the black matrix layer and the color filter layer corresponding to each main spacer, so that the distance from the top end of the secondary spacer to the substrate is smaller than the distance from the top end of the main spacer to the substrate. As a result, a difference between the distance from the top end of the main spacer to the substrate and the distance from the top end of the secondary spacer to the substrate can be varied by adjusting a difference between the sum of thicknesses of the black matrix layer and the color filter layer directly below each main spacer and the sum of thicknesses of the black matrix layer and the color filter layer directly below each secondary spacer, thereby enabling the main spacer and the secondary spacer to provide a good effect of buffering an external force.

The display substrate according to embodiments of the present invention may be a color filter substrate or array substrate in LCDs, or may also be an array substrate in OLEDs, which is not limited here. In the following, description will be made with respect to an example in which the display substrate according to embodiments of the present invention is a color filter substrate in LCD.

As shown in the FIGS. 2A-2D, a display substrate according to an embodiment of the present invention comprises: a substrate 1; a black matrix layer 2 and a color filter layer 3 located on the substrate 1; and at least one main spacer 4 and at least one secondary spacer 5 located on the black matrix layer 2 or the color filter layer 3 and both having direct projections on the substrate 1 within a region where the black matrix layer 2 is located. As shown in the figures, a sum $(h_1+h_2)$ of thicknesses of portions of the black matrix layer 2 and the color filter layer 3 corresponding to each secondary spacer 5 is smaller than a sum $(h_3+h_4)$ of portions of the black matrix layer 2 and color filter layer 3 corresponding to each main spacer 4, so that a distance from a top end of the secondary spacer 5 to the substrate 1 is smaller than a distance from a top end of the main spacer 4 to the substrate 1.

In the display substrate according to this embodiment of the present invention, as shown in the FIGS. 2A-2D, the black matrix layer 2 may be arranged between the color filter layer 3 and the substrate 1; or, the color filter layer 3 may be arranged between the black matrix layer 2 and the substrate 1, which is not limited here. In the following, an arrangement in which the black matrix layer 2 is located between the color filter layer 3 and the substrate 1 will be taken as an example and be described.

Figure 2A:
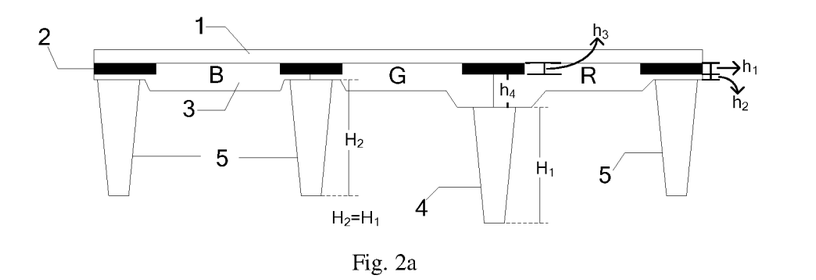
FIG. 2A is a schematic structural view of a display substrate according to an embodiment of the present invention.

In an example of the display substrate according to this embodiment of the present invention, as shown in the FIG. 2A, a thickness of a portion of the black matrix layer 2 corresponding to or overlapped with the secondary spacer 5 is $h_1$, and a thickness of a portion of the black matrix layer 2 corresponding to or overlapped with the main spacer 4 is $h_3$, a thickness $h_2$ of a portion of the color filter layer 3 corresponding to or overlapped with the secondary spacer 5 is smaller than a thickness $h_4$ of a portion of the color filter layer 3 corresponding to or overlapped with the main spacer 4, so that a sum $(h_1+h_2)$ of thicknesses of portions of the black matrix layer 2 and the color filter layer 3 corresponding to each secondary spacer 5 is smaller than a sum $(h_3+h_4)$ of portions of the black matrix layer 2 and color filter layer 3 corresponding to each main spacer 4, and thus a distance from a top end of the secondary spacer 5 to the substrate 1 is smaller than a distance from a top end of the main spacer 4 to the substrate 1, thereby enabling the main spacer 4 and the secondary spacer 5 to provide a good effect of buffering an external force.

Figure 2B:
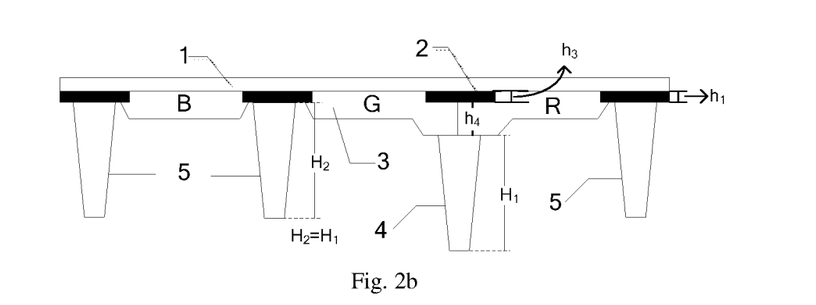
FIG. 2B is a schematic structural view of a display substrate according to another embodiment of the present invention.

In another example of the display substrate according to this embodiment of the present invention, as shown in the FIG. 2B, the thickness $h_2$ of the portion of the color filter layer 3 corresponding to the secondary spacer 5 may be set to be zero, that is, the secondary spacer 5 is directly formed on the black matrix layer 2, as a result, compared with the arrangement of the display substrate shown in the FIG. 2A, there is a larger difference between the distance from the top end of the secondary spacer 5 to the substrate 1 and the distance from the top end of the main spacer 4 to the substrate 1, so that a deformation amount of a liquid crystal display comprising the display substrate shown in the FIG. 2B under an external force is larger. Therefore, the expression "sum of thicknesses of the black matrix layer and the color filter layer directly below the main spacer/secondary spacer" as used herein may include a case in which a thickness of the portion of the color filter layer directly below or overlapped with the main spacer/secondary spacer is zero, in other words, the main spacer/secondary spacer may be directly provided on the black matrix layer.

Figure 2C:
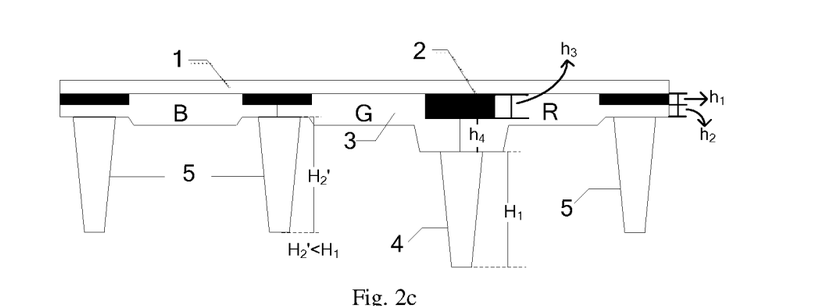
FIG. 2C is a schematic structural view of a display substrate according to a further embodiment of the present invention.

In the display substrate according to this embodiment of the present invention, when the thickness $h_2$ of the portion of the color filter layer 3 corresponding to the secondary spacer 5 is smaller than the thickness $h_4$ of the portion of the color filter layer 3 corresponding to the main spacer 4, as shown in the FIG. 2A, the thickness $h_1$ of the portion of the black matrix layer 2 corresponding to the secondary spacer 5 may be set to be equal to the thickness $h_3$ of the portion of the black matrix layer 2 corresponding to the main spacer 4, for example, the black matrix layer 2 has a uniform thickness over the substrate 1, thereby simplifying processes of manufacturing the black matrix layer 2; or, as shown in the FIG. 2C, the thickness $h_1$ of the portion of the black matrix layer 2 corresponding to the secondary spacer 5 may be set to be smaller than the thickness $h_3$ of the portion of the black matrix layer 2 corresponding to the main spacer 4, thus a difference between the distance from the top end of the secondary spacer 5 to the substrate 1 and the distance from the top end of the main spacer 4 to the substrate 1 may be increased, so that an allowable deformation amount of a liquid crystal display comprising the display substrate shown in the FIG. 2C under an external force may be further increased.

Figure 2D:
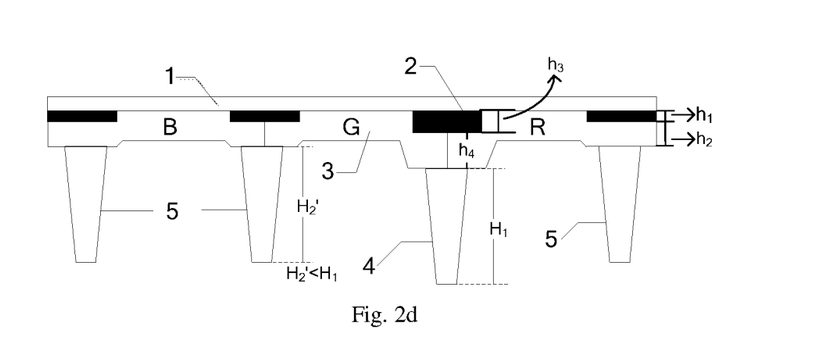
FIG. 2D is a schematic structural view of a display substrate according to a still further embodiment of the present invention.

In a further example of the display substrate according to this embodiment of the present invention, as shown in the FIG. 2D, the thickness $h_2$ of the portion of the color filter layer 3 corresponding to or overlapped with the secondary spacer 5 is equal to the thickness $h_4$ of the portion of the color filter layer 3 corresponding to or overlapped with the main spacer 4, and the thickness $h_1$ of the portion of the black matrix layer 2 corresponding to or overlapped with the secondary spacer 5 is smaller than the thickness $h_3$ of the portion of the black matrix layer 2 corresponding to or overlapped with the main spacer 4. As a result, a sum ($h_1+h_2$) of thicknesses of portions of the black matrix layer 2 and the color filter layer 3 corresponding to each secondary spacer 5 is smaller than a sum ($h_3+h_4$) of portions of the black matrix layer 2 and color filter layer 3 corresponding to each main spacer 4, and thus a distance from a top end of the secondary spacer 5 to the substrate 1 is smaller than a distance from a top end of the main spacer 4 to the substrate 1, thereby enabling the main spacer 4 and the secondary spacer 5 to provide a good effect of buffering an external force; and, when the thickness $h_2$ of the portion of the color filter layer 3 corresponding to the secondary spacer 5 is set to be equal to the thickness $h_4$ of the portion of the color filter layer 3 corresponding to the main spacer 4, for example, the color filter layer 3 has a uniform thickness over the substrate, processes of manufacturing the color filter layer 3 may be simplified.

In the display substrate according to embodiments of the present invention, in some examples as shown in the FIGS. 2a and 2b, a height $H_2$ of the secondary spacer 5 is equal to a height $H_1$ of the main spacer 4 ($H_2=H_1$), and a direct projection area of the secondary spacer 5 on the substrate 1 is equal to that of the main spacer 4 on the substrate 1, as a result, the secondary spacer 5 may have a good height uniformity, thereby the main spacer 4 and the secondary spacer 5 may provide a better effect of buffering an external force; or, in other examples, as shown in the FIG. 2c and FIG. 2d, the height $H_2'$ of the secondary spacer 5 may be set to be smaller than the height $H_1$ of main spacer 4 ($H_2'<H_1$), and the direct projection area of the secondary spacer 5 on the substrate 1 is slightly reduced, as a result, the difference between the distance from the top end of the secondary spacer 5 to the substrate 1 and the distance from the top end of the main spacer 4 to the substrate 1 may be further increased while ensuring a height uniformity of the secondary spacer 5, thereby further increasing an allowable deformation amount of the liquid crystal display under an external force.

It is noted that, the display substrate according to embodiments of the present invention is not limited to examples shown in FIGS. 2A-2D, rather, thicknesses of the black matrix layer and the color filter layer directly below the main spacer, thicknesses of the black matrix layer and the color filter layer directly below the secondary spacer, and heights of the main spacer and the secondary spacer may be properly adjusted based on the allowable deformation amount of the liquid crystal display, so that there is an appropriate difference between the distance from the top end of the main spacer to the substrate and the distance from the top end of the secondary spacer to the substrate, thereby enabling the main spacer and the secondary spacer to provide a good effect of buffering an external force. For example, both the main spacer and the secondary spacer may be directly formed on the black matrix layer, and the thickness of the portion of the black matrix layer corresponding to the main spacer is larger than that of the portion of the black matrix layer corresponding to the secondary spacer; or, the main spacer and the secondary spacer may have the same height, the thickness of the portion of the black matrix layer corresponding to the main spacer may be different from that of the portion of the black matrix layer corresponding to the secondary spacer, and the thickness of the portion of the color filter layer corresponding to the main spacer may be different from that of the portion of the color filter layer corresponding to the secondary spacer, as long as the sum of thicknesses of portions of the black matrix layer and the color filter layer corresponding to each secondary spacer is smaller than the sum of portions of the black matrix layer and color filter layer corresponding to each main spacer. As an alternative, the main spacer may have a different height from that of the secondary spacer, or even the thickness of the secondary spacer is larger than that of the main spacer, as long as thicknesses of the black matrix layer and the color filter layer directly below the main spacer and thicknesses of the black matrix layer and the color filter layer directly below the secondary spacer are properly designed and formed so that a sum of the height of the main spacer and the thicknesses of portions of the black matrix layer and the color filter layer directly below or overlapped with the main spacer is larger than a sum of the height of the secondary spacer and thicknesses of portions of the black matrix layer and the color filter layer directly below the secondary spacer. It can be understood that, the display substrate may have various thickness or height combinations of the black matrix layer, the color filter layer, the main spacer and the secondary spacer. For example, a portion of the display substrate may comprise some of the arrangement shown in FIG. 2A while another portion thereof may employ some of the arrangement shown in FIG. 2B, 2C or 2D or other arrangement.

Figure 3:
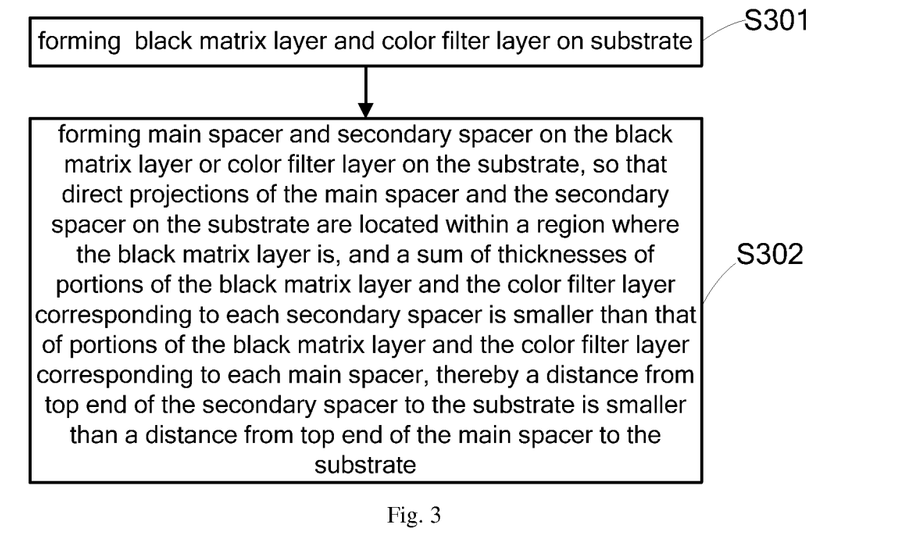
FIG. 3 is a flow chart showing a method of manufacturing a display substrate according to an embodiment of the present invention.

Based on the same inventive concept, embodiments of the present invention also provide a method of manufacturing a display substrate. As shown in the FIG. 3, the method comprises steps of:

S301, forming a black matrix layer and a color filter layer on a substrate; it can be understood from the above that the sequence of forming the black matrix layer and color filter layer is not limited;

S302, forming, on the substrate on which the black matrix layer and the color filter layer have been formed, at least one main spacer and at least one secondary spacer on the black matrix layer or the color filter layer, so that direct projections of the main spacer and the secondary spacer on the substrate are within a region where the black matrix layer is located, and a sum of thicknesses of portions of the black matrix layer and the color filter layer corresponding to each secondary spacer is smaller than that of portions of the black matrix layer and the color filter layer corresponding to each main spacer, thereby a distance from a top end of the secondary spacer to the substrate is smaller than a distance from a top end of the main spacer to the substrate.

According to the method of manufacturing the display substrate provided in the embodiments of the present invention, the sum of thicknesses of portions of the black matrix layer and the color filter layer corresponding to each secondary spacer is smaller than that of portions of the black matrix layer and the color filter layer corresponding to each main spacer, so that the distance from the top end of the secondary spacer to the substrate is smaller than the distance from the top end of the main spacer to the substrate. As a result, a difference between the distance from the top end of the main spacer to the substrate and the distance from the top end of the secondary spacer to the substrate can be varied by adjusting a difference between the sum of thicknesses of the black matrix layer and the color filter layer directly below each main spacer and the sum of thicknesses of the black matrix layer and the color filter layer directly below each secondary spacer, thereby enabling the main spacer and the secondary spacer to provide a good effect of buffering an external force.

The display substrate obtained by the method according to embodiments of the present invention may be a color filter substrate or array substrate in LCD, or may be an array substrate in OLED, which is not limited here. In the following, description will be made with respect to an example in which the display substrate obtained by the method according to embodiments of the present invention is a color filter substrate in LCD.

In the step S301 of the above method according to embodiments of the present invention, forming the color filter layer on the substrate may be achieved in the following manner.

First, a film of color filter layer is formed on the substrate, for example, through a deposition or sputtering process.

Then, the film of color filter layer is patterned so as to form the color filter layer, so that a thickness of a portion of the color filter layer corresponding to the secondary spacer to be formed is smaller than that of a portion of the color filter layer corresponding to the main spacer to be formed. As a result, a sum of thicknesses of portions of the formed black matrix layer and color filter layer corresponding to each secondary spacer is smaller than that of portions of the formed black matrix layer and the color filter layer corresponding to each main spacer, thereby a distance from a top end of the secondary spacer to the substrate is smaller than a distance from a top end of the main spacer to the substrate, enabling the main spacer and the secondary spacer to provide a good effect of buffering an external force.

Further, in the above method according to embodiments of the present invention, the thickness of the portion of the color filter layer corresponding to the secondary spacer to be formed may be set to be zero, that is, the secondary spacer is directly formed on the black matrix layer. As a result, there is a larger difference between the distance from the top end of the secondary spacer to the substrate and the distance from the top end of the main spacer to the substrate, so that when applying the display substrate manufactured by the above method to a liquid crystal display, the liquid crystal display may have a larger allowable deformation amount under an external force.

In the above method according to embodiments of the present invention, when the thickness of the portion of the color filter layer corresponding to the secondary spacer to be formed is smaller than the thickness of the portion of the color filter layer corresponding to the main spacer to be formed, forming the black matrix layer on the substrate in the step S301 may be achieved in the following manner.

First, a film of black matrix layer is formed on the substrate, for example, through a deposition or sputtering process.

Then, the film of black matrix layer is patterned so as to form the black matrix layer, so that a thickness of a portion of the black matrix layer corresponding to the secondary spacer to be formed is smaller than or equal to that of a portion of the black matrix layer corresponding to the main spacer to be formed. As a result, when the thickness of the portion of the black matrix layer corresponding to the secondary spacer to be formed is smaller than that of the portion of the black matrix layer corresponding to the main spacer to be formed, a difference between the distance from the top end of the secondary spacer to the substrate and the distance from the top end of the main spacer to the substrate may be further increased, so that an allowable deformation amount of a liquid crystal display comprising the display substrate under an external force may be further increased. When the thickness of the portion of the black matrix layer corresponding to the secondary spacer to be formed is equal to that of the portion of the black matrix layer corresponding to the main spacer to be formed, the processes of manufacturing the black matrix layer may be simplified.

In a manufacturing method according to another embodiment of the present invention, forming the black matrix layer on the substrate in step S301 may be achieved in the following manner.

First, a film of black matrix layer is formed on the substrate, for example, through a deposition or sputtering process.

Then, the film of black matrix layer is patterned so as to form the black matrix layer, so that a thickness of a portion of the black matrix layer corresponding to the secondary spacer to be formed is smaller than that of a portion of the black matrix layer corresponding to the main spacer to be formed.

In this embodiment, forming the color filter layer on the substrate in step S301 of the above method may be achieved in the following manner.

First, a film of color filter layer is formed on the substrate, for example, through a deposition or sputtering process.

Then, the film of color filter layer is patterned so as to form the color filter layer, so that a thickness of a portion of the color filter layer corresponding to the secondary spacer to be formed is equal to that of a portion of the color filter layer corresponding to the main spacer to be formed. As a result, a sum of thicknesses of portions of the black matrix layer and color filter layer corresponding to each secondary spacer is smaller than that of portions of the formed black matrix layer and the color filter layer corresponding to each main spacer, thereby a distance from a top end of the secondary spacer to the substrate is smaller than a distance from a top end of the main spacer to the substrate, enabling the main spacer and the secondary spacer to provide a good effect of buffering an external force, Moreover, since the thickness of the portion of the color filter layer corresponding to the secondary spacer to be formed is equal to that of the portion of the color filter layer corresponding to the main spacer to be formed, the processes of manufacturing the color filter layer may be simplified.

According to one embodiment of the present invention, in the step S302 of the above method, the main spacer and the secondary spacer may be formed, through a single one patterning process, on the substrate on which the black matrix layer and the color filter layer have been formed, wherein a height of the secondary spacer is smaller than or equal to that of the main spacer. When the height of the secondary spacer is equal to that of the main spacer, a direct projection area of the secondary spacer on the substrate is equal to a direct projection area of the main spacer on the substrate, and the secondary spacer has a good height uniformity, enabling the main spacer and the secondary spacer to provide a better effect of buffering an external force. When the height of the secondary spacer is smaller than that of the main spacer, the direct projection area of the secondary spacer on the substrate is slightly smaller than the direct projection area of the main spacer on the substrate, as a result, the difference between the distance from the top end of the secondary spacer to the substrate and the distance from the top end of the main spacer to the substrate may be further increased while ensuring a height uniformity of the secondary spacer, thereby further increasing an allowable deformation amount of the liquid crystal display under an external force.

It is noted that, when the above method of manufacturing the display substrate according to embodiments of the present invention is put into practice, thicknesses of the black matrix layer and the color filter layer directly below the main spacer, thicknesses of the black matrix layer and the color filter layer directly below the secondary spacer, and heights of the main spacer and the secondary spacer may be properly adjusted based on the allowable deformation amount of the liquid crystal display, so that there is an appropriate difference between the distance from the top end of the main spacer to the substrate and the distance from the top end of the secondary spacer to the substrate, thereby enabling the main spacer and the secondary spacer to provide a good effect of buffering an external force.

In the following, the method of manufacturing the display substrate according to embodiments of the present invention will be described in detail with respect to two specific examples, in which the color filter layer of the display substrate includes red color resistors R, green color resistors G and blue color resistors B.

Example 1

Figure 4A:
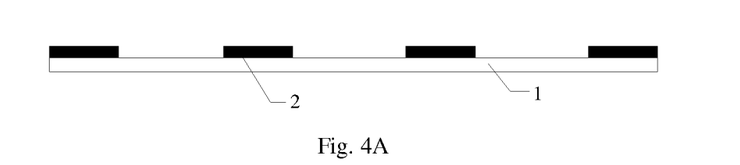
FIGS. 4A-4E are schematic structural views respectively showing configurations obtained after performing respective steps in a method of manufacturing a display substrate according to an embodiment of the present invention.
Figure 4B:
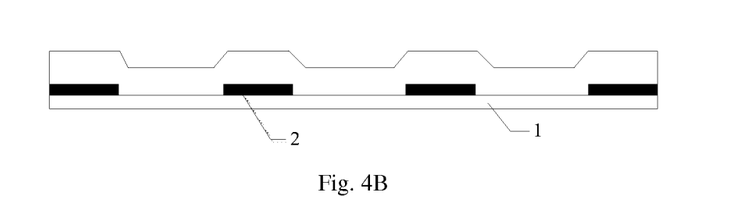
Figure 4C:
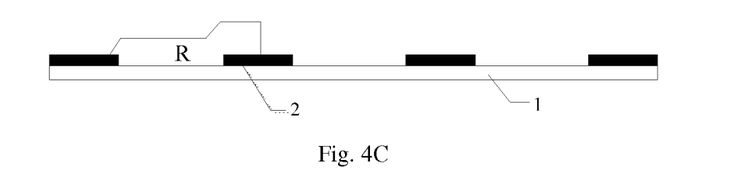
Figure 4D:
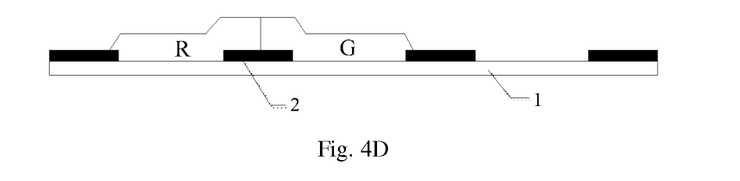
Figure 4E:
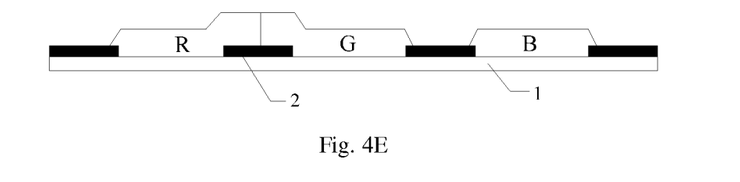

A method of manufacturing the display substrate shown in the FIG. 2B may comprise steps of:

(1) forming a pattern of a black matrix layer 2 on a substrate 1, as shown in the FIG. 4A; wherein arrangement of the pattern of the black matrix layer 2 is the same as prior art arrangements, which is not repeatedly described here;

(2) forming a layer of red color resistor film on the substrate 1 on which the pattern of the black matrix layer 2 has been formed, as shown in the FIG. 4B;

(3) patterning the red color resistor film so as to form a pattern of red color resistors R, as shown in the FIG. 4C; wherein a thickness of a portion of the pattern of red color resistors R corresponding to a secondary spacer to be formed is zero;

(4) forming a pattern of green color resistors G on the substrate 1 on which the pattern of red color resistors R has been formed, as shown in the FIG. 4D; wherein a thickness of a portion of the pattern of green color resistors G corresponding to a secondary spacer to be formed is zero; the pattern of green color resistors G is formed in a similar way as the pattern of red color resistors R, which is not repeatedly described here;

(5) forming a pattern of blue color resistors B on the substrate 1 on which the pattern of green color resistors G has been formed, as shown in the FIG. 4E; wherein a thickness of a portion of the pattern of blue color resistors B corresponding to the secondary spacer to be formed is zero; the pattern of blue color resistors B is formed in a similar way as the pattern of red color resistors R, which is not repeatedly described here; and (6) forming a pattern including main spacer(s) 4 and secondary spacer(s) 5 on the substrate 1 on which a pattern of the color filter layer 3 including the red color resistors R, the green color resistors G and the blue color resistors B has been formed, as shown in the FIG. 2B. Preferably, a height of the main spacer 4 is equal to that of the secondary spacer 5.

Example 2

Figure 5A:
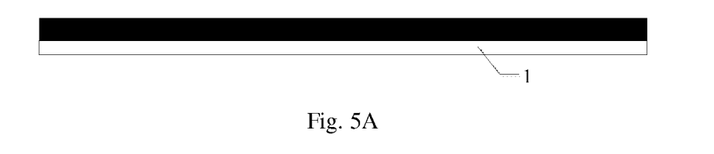
FIGS. 5A-5E are schematic structural views respectively showing configurations obtained after performing respective steps in a method of manufacturing a display substrate according to another embodiment of the present invention.
Figure 5B:
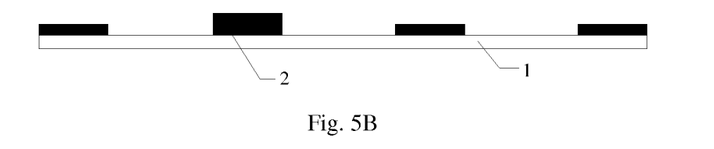
Figure 5C:
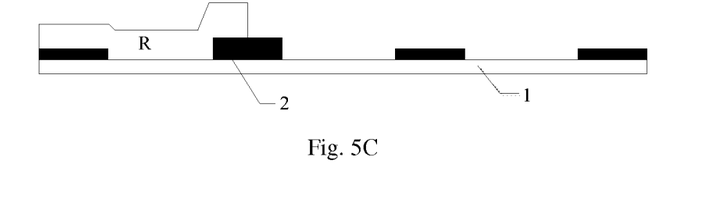
Figure 5D:
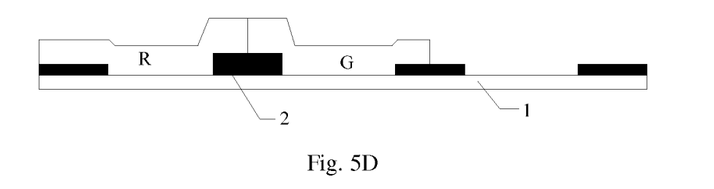
Figure 5E:
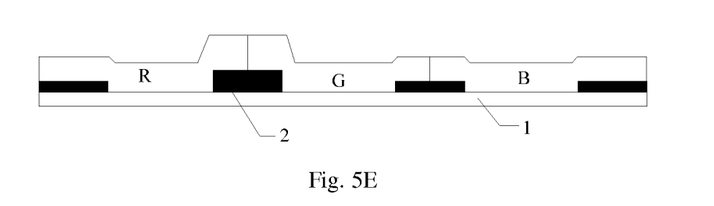

The method of manufacturing the display substrate shown in the FIG. 2D may comprise steps of:

(1) forming a film of black matrix layer on a substrate 1, as shown in the FIG. 5A;

(2) patterning the film of black matrix layer by using a half tone mask plate so as to form a pattern of black matrix layer 2, as shown in the FIG. 5B; wherein a completely transparent area of the half tone mask plate corresponds to a portion of the black matrix layer 2 corresponding to the main spacer to be formed, a partly transparent area of the half tone mask plate corresponds to a portion of the black matrix layer 2 corresponding to the secondary spacer to be formed, and a light shielding area of the half tone mask plate corresponds to regions of the substrate 1 where no black matrix layer is formed;

(3) forming a pattern of red color resistors R on the substrate 1 on which the pattern of the black matrix layer 2 has been formed, as shown in the FIG. 5C; wherein arrangement of the pattern of red color resistors R is the same as prior art arrangement, which is not repeatedly described here;

(4) forming a pattern of green color resistors G on the substrate 1 on which the pattern of red color resistors R has been formed, as shown in the FIG. 5D; wherein arrangement of the pattern of green color resistors G is the same as prior art arrangement, which is not repeatedly described here;

(5) forming a pattern of blue color resistors B on the substrate 1 on which the pattern of green color resistors G has been formed, as shown in the FIG. 5E; wherein arrangement of the pattern of blue color resistors B is the same as prior art arrangement, which is not repeatedly described here; and (6) forming a pattern including main spacer(s) 4 and secondary spacer(s) 5 on the substrate 1 on which a pattern of the color filter layer 3 including the red color resistors R, the green color resistors G and the blue color resistors B has been formed. Preferably, a height of the main spacer 4 is equal to that of the secondary spacer 5.

Based on the same inventive concept, embodiments of the present invention further provide a display device comprising the display substrate provided in the above embodiments of the present invention. The display device may be any products or parts having a displaying function, such as a mobile phone, a tablet PC, a TV set, a displayer, a notebook PC, a digital frame, a navigator, and so on.

Embodiments of the present invention provide a display substrate and a method of manufacturing the same, and a display device comprising the display substrate. The display substrate comprises: a substrate; a black matrix layer and a color filter layer located on the substrate; and at least one main spacer and at least one secondary spacer located on the black matrix layer or the color filter layer and both having direct projections on the substrate within a region where the black matrix layer is located, wherein, a sum of thicknesses of portions of the black matrix layer and the color filter layer corresponding to each secondary spacer is smaller than that of portions of the black matrix layer and the color filter layer corresponding to each main spacer, so that a distance from a top end of the secondary spacer to the substrate is smaller than a distance from a top end of the main spacer to the substrate. As a result, a difference between the distance from the top end of the main spacer to the substrate and the distance from the top end of the secondary spacer to the substrate can be varied by adjusting a difference between the sum of thicknesses of the black matrix layer and the color filter layer directly below each main spacer and the sum of thicknesses of the black matrix layer and the color filter layer directly below each secondary spacer, thereby enabling the main spacer and the secondary spacer to provide a good effect of buffering an external force.

Although several exemplary embodiments have been shown and described, it would be appreciated by those skilled in the art that various changes or modifications may be made in these embodiments without departing from the principle and spirit of the disclosure, the scope of which is defined in the claims and their equivalents.

What is claimed is:

1. A display substrate, comprising:
  a substrate;
  a black matrix layer and a color filter layer located on the substrate; and
  at least one main spacer and at least one secondary spacer located on the black matrix layer or the color filter layer and both having direct projections on the substrate within a region where the black matrix layer is located;
  wherein, a sum of thicknesses of portions of the black matrix layer and the color filter layer corresponding to each secondary spacer is smaller than that of portions of the black matrix layer and the color filter layer corresponding to each main spacer, so that a distance from a top end of the main spacer to the substrate is larger than distances from top ends of other spacers located on the substrate to the substrate, and
  wherein a height of the secondary spacer is equal to that of the main spacer, and the thickness of the portion of the color filter layer corresponding to the main spacer is larger than that of the portion of the color filter layer corresponding to the secondary spacer located adjacent to the main spacer.

2. The display substrate according to claim 1, wherein the thickness of the portion of the color filter layer corresponding to the secondary spacer is zero.

3. The display substrate according to claim 2, wherein the thickness of the portion of the black matrix layer corresponding to the secondary spacer is smaller than or equal to that of the portion of the black matrix layer corresponding to the main spacer.

4. A display device comprising the display substrate according to claim 1.

5. The display device according to claim 4, wherein the thickness of the portion of the color filter layer corresponding to the secondary spacer is zero.

6. The display device according to claim 5, wherein the thickness of the portion of the black matrix layer corresponding to the secondary spacer is smaller than or equal to that of the portion of the black matrix layer corresponding to the main spacer.

7. The display substrate according to claim 1, wherein the color filter layer comprises a plurality of color resistors, and wherein the at least one main spacer is located on two of the plurality of color resistors having different colors, and/or the at least one secondary spacer is located on another two of the plurality of color resistors having different colors.

8. A method of manufacturing a display substrate, comprising:
  forming a black matrix layer and a color filter layer on a substrate; and
  forming, over the substrate on which the black matrix layer and the color filter layer have been formed, at least one main spacer and at least one secondary spacer on the black matrix layer or the color filter layer such that:
    direct projections of the main spacer and the secondary spacer on the substrate are located within a region where the black matrix layer is located,
    a sum of thicknesses of portions of the black matrix layer and the color filter layer corresponding to each secondary spacer is smaller than that of portions of the black matrix layer and the color filter layer corresponding to each main spacer,
    a distance from a top end of the main spacer to the substrate is larger than distances from top ends of other spacers located on the substrate to the substrate,
    a height of the secondary spacer is equal to that of the main spacer, and
    the thickness of the portion of the color filter layer corresponding to the main spacer is larger than that of the portion of the color filter layer corresponding to the secondary spacer located adjacent to the main spacer.

9. The method according to claim 8, wherein forming the color filter layer on the substrate comprises:
  forming a film of color filter layer on the substrate;
  patterning the film of color filter layer so as to form the color filter layer.

10. The method according to claim 9, wherein forming the black matrix layer on the substrate comprises:
  forming a film of black matrix layer on the substrate;
  patterning the film of black matrix layer so as to form the black matrix layer;
  wherein a thickness of a portion of the black matrix layer corresponding to the secondary spacer to be formed is smaller than or equal to that of a portion of the black matrix layer corresponding to the main spacer to be formed.

11. The method according to claim 8, wherein:
forming the black matrix layer on the substrate comprises:
forming a film of black matrix layer on the substrate; and
patterning the film of black matrix layer so as to form the black matrix layer;
wherein a thickness of a portion of the black matrix layer corresponding to the secondary spacer to be formed is smaller than that of a portion of the black matrix layer corresponding to the main spacer to be formed; and
forming the color filter layer on the substrate comprises:
forming a film of color filter layer on the substrate; and
patterning the film of color filter layer so as to form the color filter layer.

12. The method according to claim 11, wherein the film of black matrix layer is patterned by using a half tone mask plate so as to form the black matrix layer, and wherein a completely transparent area of the half tone mask plate corresponds to a portion of the black matrix layer corresponding to the main spacer to be formed, a partly transparent area of the half tone mask plate corresponds to a portion of the black matrix layer corresponding to the secondary spacer to be formed, and a light shielding area of the half tone mask plate corresponds to regions of the substrate where no black matrix layer is formed.

13. The method according to claim 8, wherein forming the at least one main spacer and the at least one secondary spacer on the black matrix layer or the color filter layer comprises:
forming a spacer layer on the substrate on which the black matrix layer and the color filter layer have been formed; and
performing a single one patterning process on the spacer layer so as to form the at least one main spacer and the at least one secondary spacer.

14. The method according to claim 8, wherein the thickness of the portion of the color filter layer corresponding to the secondary spacer to be formed is zero.

15. The method according to claim 8, wherein forming the color filter layer on the substrate includes forming a plurality of color resistors, and wherein the at least one main spacer is located on two of the plurality of color resistors having different colors, and/or at least one secondary spacer is located on another two of the plurality of color resistors having different colors.

* * * * *